(12) United States Patent
Korodi et al.

(10) Patent No.: US 8,077,064 B2
(45) Date of Patent: Dec. 13, 2011

(54) METHOD AND DEVICE FOR BUFFER-BASED INTERLEAVED ENCODING OF AN INPUT SEQUENCE

(75) Inventors: Gergely Ferenc Korodi, Waterloo (CA); Dake He, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 143 days.

(21) Appl. No.: 12/713,576

(22) Filed: Feb. 26, 2010

(65) Prior Publication Data

US 2011/0210874 A1  Sep. 1, 2011

(51) Int. Cl.
  *H03M 7/00* (2006.01)
(52) U.S. Cl. .......................................... 341/107; 341/51
(58) Field of Classification Search ............... 341/51, 341/107
  See application file for complete search history.

(56) References Cited

U.S. PATENT DOCUMENTS

| | | | |
|---|---|---|---|
| 5,148,272 A | | 9/1992 | Acampora |
| 5,717,394 A | | 2/1998 | Schwartz |
| 6,661,839 B1 | | 12/2003 | Ishida |
| 6,894,628 B2 | * | 5/2005 | Marpe et al. ............ 341/107 |
| 7,262,721 B2 | * | 8/2007 | Jeon et al. ............... 341/107 |
| 7,443,318 B2 | * | 10/2008 | Hung et al. .............. 341/51 |
| 2007/0150497 A1 | | 6/2007 | De La Cruz |

FOREIGN PATENT DOCUMENTS

| | | |
|---|---|---|
| GB | 2 285 374 | 7/1995 |
| WO | WO2009/005758 | 1/2009 |

OTHER PUBLICATIONS

Freking R A et al: An unrestrictedly parallel scheme for ultra-high-rate reprogrammable Huffman coding ICASSP-, IEEE International Conference on Acoustics, Speech and Signal Processing—Proceedings 1999 IEEE vol. 4, Mar. 15, 1999, pp. 1937-1940, XP010327787.
European Search Report dated Jul. 21, 2010.
Shay-Beren et al: "Class-based decompressor design for compressed instruction memory in embedded processors" IEEE Transactions on Computers, IEEE Service Center, Los Alamitos, CA, US LNKD D01:10.1109/TC.2003.1244947, vol. 52, No. 11, Nov. 1, 2003, pp. 1495-1500, XP011103299.
Marpe D et al: "Context-based adaptive binary arithmetic coding in the H.264/AVC video compression standard" IEEE Transactions on Circuits and Systems for Video Technology, IEEE Service Center, Piscataway, NJ, US LNKD DOI:10.1109/TCSVT,2003.815173, vol. 13, No. 7, Jul. 1, 2003, pp. 620-636, XP011099255.
European Search Report dated Aug. 3, 2010.

(Continued)

*Primary Examiner* — Khai M Nguyen
(74) *Attorney, Agent, or Firm* — Rowand Intellectual Property Law

(57) ABSTRACT

A method for encoding an input sequence of symbols. The method includes, sequentially, for each symbol in the input sequence, determining an estimated probability for that symbol based on a context model, identifying a codeword associated with a sequence of symbols resulting from appending that symbol to a previous sequence of symbols associated with that estimated probability, using an encoding tree associated with that estimated probability, and storing the codeword in a buffer element of a first-in-first-out buffer, wherein the buffer element is associated with the estimated probability. Stored codewords are output from the buffer in a first-in-first-out order.

21 Claims, 9 Drawing Sheets

OTHER PUBLICATIONS

Franaszek P et al: "Parallel compression with cooperative dictionary construction" Data Compression Conference, 1996. DCC '96. Proceedings Snowbird; UT, USA Mar. 31,-Apr. 3, 1996, Los Alamitos, CA, USA,IEEE Comput. SOC, US LNKD- D01:10.1109/DCC. 1996.488325, Mar. 31, 1996, pp. 200-209, XP010156561.

Marpe D et al: "Context-based adaptive binary arithmetic coding in the H.264/AVC video compression standard" IEEE Transactions on Circuits and Systems for Video Technology, IEEE Service Center, Piscataway, NJ, US LNKD D01:10.1109/TCSVT.2003.815173,vol. 13, No. 7, Jul. 1, 2003, pp. 620-636, XP011099255 ISSN: 1051-8215.

European Search Report dated Aug. 12, 2010.

ITU-T Recommendation H.264/ISO/IEC 14496-10 AVC, Advanced video coding for general audiovisual services, Nov. 2007.

H.264/AVC reference software, available online http://iphome.hhi.de/surhring/tml/.

G.H. Freeman, "Divergence and the construction of variable-to-variable length lossless codes by source word extensions," Proc. Data Compression Conference, IEEE Computer Society Press, 1993, pp. 79-88.

W.B. Pennebaker, J. L. Mitchell, G. G. Langdon, Jr., R.B. Arps, "An overview of the basic principles of the Q-Coder adaptive binary arithmetic coder," IBM Journal of Research and Development, v.32 n. 6, p. 717-726, Nov. 1988.

Joshua Senecal, Mark Duchaineau and Kenneth I. Joy, "Length-Limited Variable-to-Variable Length Codes for High-Performance Entropy Coding," Proc. Data Compression Conference 2004, p. 389.

P.R. Stubley, "Adaptive variable-to-variable length codes," in Proc. Data Compression Conference 1994, pp. 98-105.

\* cited by examiner

METHOD AND DEVICE FOR BUFFER-BASED INTERLEAVED ENCODING OF AN INPUT SEQUENCE

FIELD

The present application generally relates to data compression and, in particular, to an encoder, a decoder and methods of entropy coding and entropy decoding.

BACKGROUND

Data compression, whether lossy or lossless, often uses entropy coding to encode a decorrelated signal as a sequence of bits, i.e. a bitstream. Efficient data compression has a wide range of applications, such as image, audio, and video encoding. The current state-of-the-art for video encoding is the ITU-T H.264/MPEG AVC video coding standard. It defines a number of different profiles for different applications, including the Main profile, Baseline profile and others.

There are a number of standards for encoding/decoding images and videos, including H.264, that employ lossy compression processes to produce binary data. For example, H.264 includes a prediction operation to obtain residual data, followed by a DCT transform and quantization of the DCT coefficients. The resulting data, including quantized coefficients, motion vectors, coding mode, and other related data, is then entropy coded to generate a bitstream of data for transmission or storage on a computer-readable medium.

A number of coding schemes have been developed to encode binary data. For example, JPEG images may be encoded using Huffman codes. The H.264 standard allows for two possible entropy coding processes: Context Adaptive Variable Length Coding (CAVLC) or Context Adaptive Binary Arithmetic Coding (CABAC). CABAC results in greater compression than CAVLC, but CABAC is more computationally demanding.

It would be advantageous to provide for an improved encoder, decoder and method of entropy coding and decoding.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
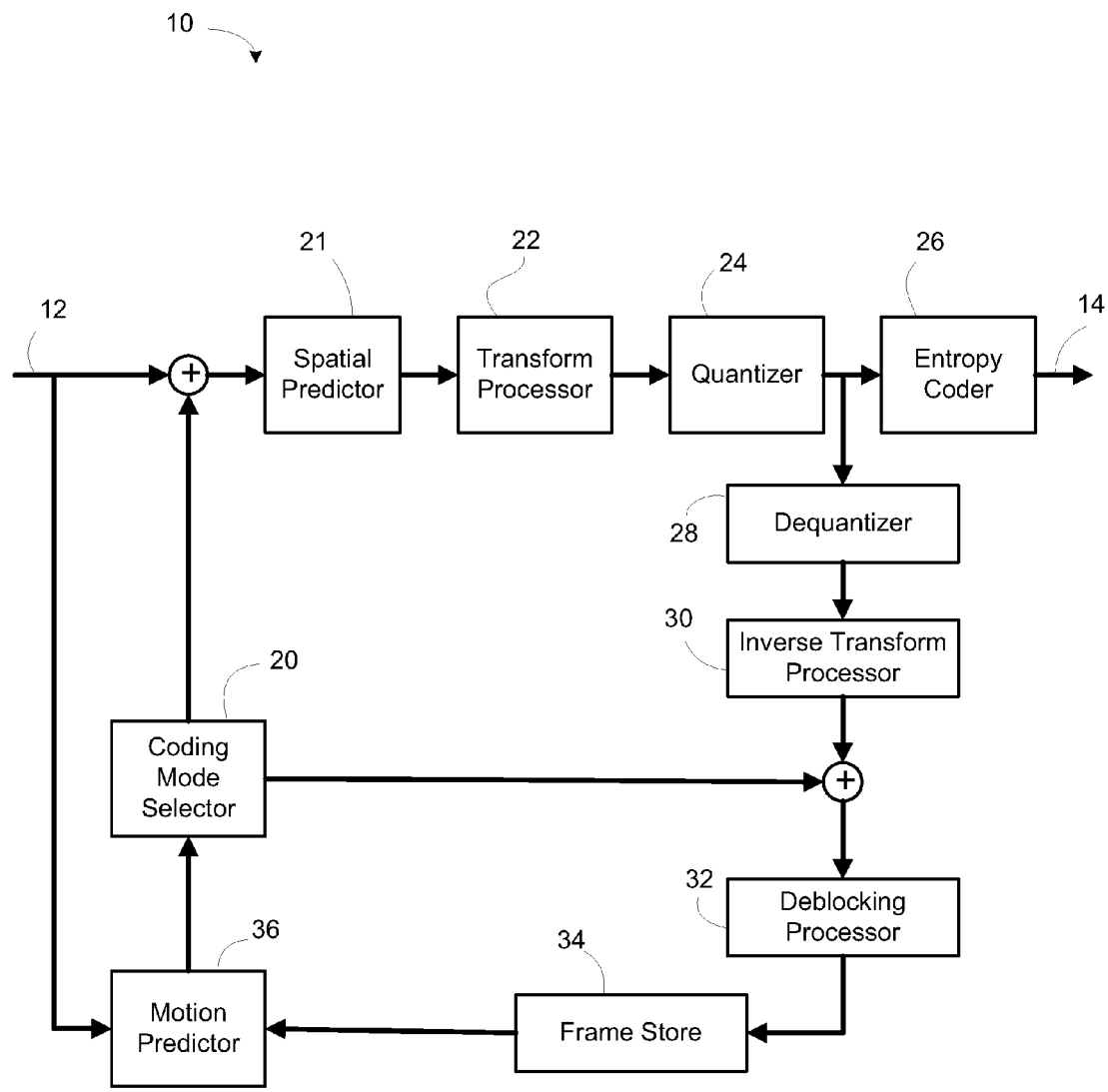
FIG. 1 shows, in block diagram form, an encoder for encoding video.

In one aspect, the present application describes a method for encoding an input sequence of symbols. The method includes selecting an encoding tree based on an estimated probability determined from a context model; and traversing the encoding tree based on the input sequence of symbols until either a leaf node is reached, and in response, outputting a primary codeword associated with the leaf node, or a flush event occurs while at an internal node of the encoding tree, and in response, outputting a secondary codeword associated with the internal node.

In another aspect, the present application describes a method for decoding a bitstream of encoded data to generate a reconstructed binary sequence, the bitstream containing a plurality of codewords. The method includes determining an estimated probability associated with a next bit of the reconstructed binary sequence based on a context model; and determining whether a bit associated with that estimated probability is available from a bit sequence obtained from a previously decoded codeword and, if so, adding that bit to the reconstructed binary sequence. If no such bits are available then parsing the bitstream to extract a next codeword, decoding the next codeword to obtain a new bit sequence associated with that estimated probability, and adding a bit from the new bit sequence to the reconstructed binary sequence.

In yet another aspect, the present application describes a method for encoding an input sequence of symbols. The method includes encoding the input sequence as a plurality of codewords, wherein the codewords include primary codewords and secondary codewords; and generating a bitstream including a plurality of consecutive codewords, wherein the plurality of consecutive codewords is preceded by an associated codeword type indicator, wherein the codeword type indicator specifies whether its associated plurality of consecutive codewords includes at least one secondary codeword and, if so, the location of the first of the at least one secondary codewords.

In yet a further aspect, the present application describes a method for decoding an encoded bitstream containing a plurality of codewords, including primary codewords and secondary codewords. The method includes reading a codeword type indicator in the bitstream; and based on the codeword type indicator, selecting between a primary codeword decoding tree and a secondary codeword decoding tree, and decoding one of the plurality of codewords using the selected decoding tree.

In another aspect, the present application describes a method for encoding an input sequence of symbols. The method includes, sequentially, for each symbol in the input sequence, determining an estimated probability for that symbol based on a context model, identifying a codeword associated with a sequence of symbols resulting from appending that symbol to a previous sequence of symbols associated with that estimated probability, using an encoding tree associated with that estimated probability, and storing the codeword in a buffer element of a first-in-first-out buffer, wherein the buffer element is associated with the estimated probability; and outputting stored codewords from the buffer in a first-in-first-out order.

In further aspects, the present application describes encoders for implementing the above methods. The encoders include memory, a processor, and an encoding application stored in memory and having computer-executable instructions for configuring the processor to perform the operations of the methods described herein.

In further aspects, the present application describes decoders for implementing the above methods. The decoders include memory, a processor, and a decoding application stored in memory and having computer-executable instructions for configuring the processor to perform the operations of the methods described herein.

The present application further describes computer-readable media having encoded thereon computer-executable instructions for configuring a processor to implement one or more of the methods described herein.

Other aspects and features of the present application will be understood by those of ordinary skill in the art from a review of the following description of examples in conjunction with the accompanying figures.

The following description relates to data compression in general and, in particular, to the efficient parallel encoding of finite alphabet sources, such as a binary source. In many of the examples given below, particular applications of such an encoding and decoding scheme are given. For example, many of the illustrations below make reference to video coding. It will be appreciated that the present application is not limited to video coding or image coding.

In the description that follows, example embodiments are described with reference to the H.264 standard. Those ordinarily skilled in the art will understand that the present application is not limited to H.264 but may be applicable to other video coding/decoding standards. It will also be appreciated that the present application is not necessarily limited to video coding/decoding and may be applicable to coding/decoding of any binary sources.

In the description that follows, in the context of video applications the terms frame and slice are used somewhat interchangeably. Those of skill in the art will appreciate that, in the case of the H.264 standard, a frame may contain one or more slices. It will also be appreciated that certain encoding/decoding operations are performed on a frame-by-frame basis and some are performed on a slice-by-slice basis, depending on the particular requirements of the applicable video coding standard. In any particular embodiment, the applicable video coding standard may determine whether the operations described below are performed in connection with frames and/or slices, as the case may be. Accordingly, those ordinarily skilled in the art will understand, in light of the present disclosure, whether particular operations or processes described herein and particular references to frames, slices, or both are applicable to frames, slices, or both for a given embodiment.

Figure 2:
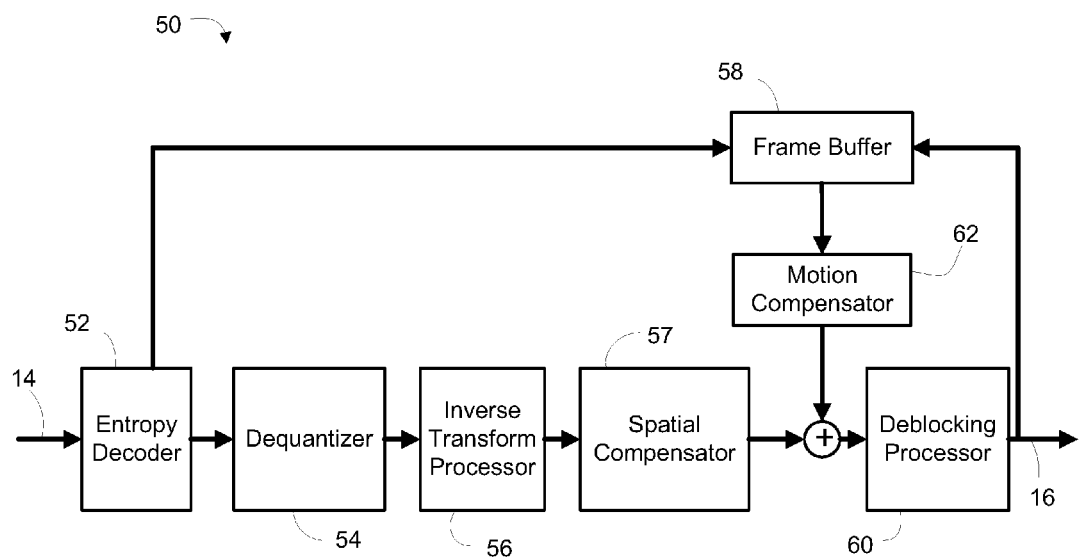
FIG. 2 shows, in block diagram form, a decoder for decoding video.

Reference is now made to FIG. 1, which shows, in block diagram form, an encoder 10 for encoding video. Reference is also made to FIG. 2, which shows a block diagram of a decoder 50 for decoding video. It will be appreciated that the encoder 10 and decoder 50 described herein may each be implemented on an application-specific or general purpose computing device, containing one or more processing elements and memory. The operations performed by the encoder 10 or decoder 50, as the case may be, may be implemented by way of application-specific integrated circuit, for example, or by way of stored program instructions executable by a general purpose processor. The device may include additional software, including, for example, an operating system for controlling basic device functions. The range of devices and platforms within which the encoder 10 or decoder 50 may be implemented will be appreciated by those ordinarily skilled in the art having regard to the following description.

The encoder 10 receives a video source 12 and produces an encoded bitstream 14. The decoder 50 receives the encoded bitstream 14 and outputs a decoded video frame 16. The encoder 10 and decoder 50 may be configured to operate in conformance with a number of video compression standards. For example, the encoder 10 and decoder 50 may be H.264/AVC compliant. In other embodiments, the encoder 10 and decoder 50 may conform to other video compression standards, including evolutions of the H.264/AVC standard.

The encoder 10 includes a spatial predictor 21, a coding mode selector 20, transform processor 22, quantizer 24, and entropy coder 26. As will be appreciated by those ordinarily skilled in the art, the coding mode selector 20 determines the appropriate coding mode for the video source, for example whether the subject frame/slice is of I, P, or B type, and whether particular macroblocks within the frame/slice are inter or intra coded. The transform processor 22 performs a transform upon the spatial domain data. In particular, the transform processor 22 applies a block-based transform to convert spatial domain data to spectral components. For example, in many embodiments a discrete cosine transform (DCT) is used. Other transforms, such as a discrete sine transform or others may be used in some instances. Applying the block-based transform to a block of pixel data results in a set of transform domain coefficients. The set of transform domain coefficients is quantized by the quantizer 24. The quantized coefficients and associated information, such as motion vectors, quantization parameters, etc., are then encoded by the entropy coder 26.

Intra-coded frames/slices (i.e. type I) are encoded without reference to other frames/slices. In other words, they do not employ temporal prediction. However intra-coded frames do rely upon spatial prediction within the frame/slice, as illustrated in FIG. 1 by the spatial predictor 21. That is, when encoding a particular block the data in the block may be compared to the data of nearby pixels within blocks already encoded for that frame/slice. Using a prediction algorithm, the source data of the block may be converted to residual data. The transform processor 22 then encodes the residual data. H.264, for example, prescribes nine spatial prediction modes for 4×4 transform blocks. In some embodiments, each of the nine modes may be used to independently process a block, and then rate-distortion optimization is used to select the best mode.

The H.264 standard also prescribes the use of motion prediction/compensation to take advantage of temporal prediction. Accordingly, the encoder 10 has a feedback loop that includes a de-quantizer 28, inverse transform processor 30, and deblocking processor 32. These elements mirror the decoding process implemented by the decoder 50 to reproduce the frame/slice. A frame store 34 is used to store the reproduced frames. In this manner, the motion prediction is based on what will be the reconstructed frames at the decoder 50 and not on the original frames, which may differ from the reconstructed frames due to the lossy compression involved in encoding/decoding. A motion predictor 36 uses the frames/slices stored in the frame store 34 as source frames/slices for comparison to a current frame for the purpose of identifying similar blocks. Accordingly, for macroblocks to which motion prediction is applied, the "source data" which the transform processor 22 encodes is the residual data that comes out of the motion prediction process. The residual data is pixel data that represents the differences (if any) between the reference block and the current block. Information regarding the reference frame and/or motion vector may not be processed by the transform processor 22 and/or quantizer 24, but instead may be supplied to the entropy coder 26 for encoding as part of the bitstream along with the quantized coefficients.

Those ordinarily skilled in the art will appreciate the details and possible variations for implementing H.264 encoders.

The decoder 50 includes an entropy decoder 52, dequantizer 54, inverse transform processor 56, spatial compensator 57, and deblocking processor 60. A frame buffer 58 supplies reconstructed frames for use by a motion compensator 62 in applying motion compensation. The spatial compensator 57 represents the operation of recovering the video data for a particular intra-coded block from a previously decoded block.

The bitstream 14 is received and decoded by the entropy decoder 52 to recover the quantized coefficients. Side information may also be recovered during the entropy decoding process, some of which may be supplied to the motion compensation loop for use in motion compensation, if applicable. For example, the entropy decoder 52 may recover motion vectors and/or reference frame information for inter-coded macroblocks.

The quantized coefficients are then dequantized by the dequantizer 54 to produce the transform domain coefficients, which are then subjected to an inverse transform by the inverse transform processor 56 to recreate the "video data". It will be appreciated that, in some cases, such as with an intra-coded macroblock, the recreated "video data" is the residual data for use in spatial compensation relative to a previously decoded block within the frame. The spatial compensator 57 generates the video data from the residual data and pixel data from a previously decoded block. In other cases, such as inter-coded macroblocks, the recreated "video data" from the inverse transform processor 56 is the residual data for use in motion compensation relative to a reference block from a different frame. Both spatial and motion compensation may be referred to herein as "prediction operations".

The motion compensator 62 locates a reference block within the frame buffer 58 specified for a particular inter-coded macroblock. It does so based on the reference frame information and motion vector specified for the inter-coded macroblock. It then supplies the reference block pixel data for combination with the residual data to arrive at the recreated video data for that macroblock.

A deblocking process may then be applied to a reconstructed frame/slice, as indicated by the deblocking processor 60. After deblocking, the frame/slice is output as the decoded video frame 16, for example for display on a display device. It will be understood that the video playback machine, such as a computer, set-top box, DVD or Blu-Ray player, and/or mobile handheld device, may buffer decoded frames in a memory prior to display on an output device.

Entropy coding is a fundamental part of all lossless and lossy compression schemes, including the video compression described above. The purpose of entropy coding is to represent a presumably decorrelated signal, often modeled by an independent, but not identically distributed process, as a sequence of bits. The technique used to achieve this must not depend on how the decorrelated signal was generated, but may rely upon relevant probability estimations for each upcoming symbol.

There are two common approaches for entropy coding used in practice: the first one is variable-length coding, which identifies input symbols or input sequences by codewords, and the second one is range (or arithmetic) coding, which encapsulates a sequence of subintervals of the [0, 1) interval, to arrive at a single interval, from which the original sequence can be reconstructed using the probability distributions that defined those intervals. Typically, range coding methods tend to offer better compression, while VLC methods have the potential to be faster. In either case, the symbols of the input sequence are from a finite alphabet.

A special case of entropy coding is when the input alphabet is restricted to binary symbols. Here VLC schemes must group input symbols together to have any potential for compression, but since the probability distribution can change after each bit, efficient code construction is difficult. Accordingly, range encoding is considered to have greater compression due to its greater flexibility, but practical applications are hindered by the higher computational requirements of arithmetic codes.

In some important practical applications, such as high-quality video decoding, the entropy decoder has to reach very high output speed, which can pose a problem for devices with limited processing power or speed. For many such devices CABAC is too computationally demanding.

One of the techniques used in some entropy coding schemes, such as CAVLC and CABAC, both of which are used in H.264/AVC, is context modeling. With context modeling, each bit of the input sequence has a context, where the context is given by the bits that preceded it. In a first-order context model, the context may depend entirely upon the previous bit (symbol). In many cases, the context models may be adaptive, such that the probabilities associated with symbols for a given context may change as further bits of the sequence are processed.

Figure 3:
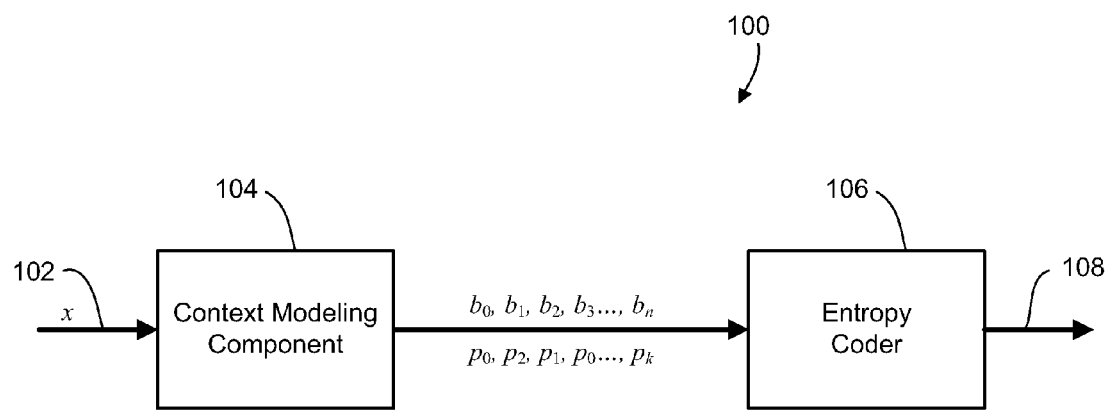
FIG. 3 shows a block diagram of an encoding process.

Reference is made to FIG. 3, which shows a block diagram of an encoding process 100. The encoding process 100 includes a context modeling component 104 and an entropy coder 108. The context modeling component 104 receives the input sequence x 102, which in this example is a bit sequence $(b_0, b_1, \ldots, b_n)$. The context modeling component 104 determines a context for each bit $b_i$ based on one or more previous bits in the sequence, and determines, based on the adaptive context model, a probability $p_i$ associated with that bit $b_i$. This is the probability that the bit is a particular symbol; in a binary alphabet $p_i$ is typically the probability that the bit is a least probable symbol. The context modeling component outputs the input sequence, i.e. the bits $(b_0, b_1, \ldots, b_n)$ along with their respective probabilities $(p_0, p_1, \ldots, p_n)$. The probabilities are an estimated probability determined by the context model. This data is then input to the entropy coder 106, which encodes the input sequence using the probability information. For example, the entropy coder 106 may be a binary arithmetic coder. The entropy coder 106 outputs a bitstream 108 of encoded data. Those skilled in the art will appreciate that in many implementations the context modeling component 104 may receive higher order data, such as the coefficients and motion vectors, etc., from which it generates the input sequence of bits and their respective probabilities.

In the description that follows, reference may be made to embodiments for entropy encoding a binary sequence. It will be understood that the described processes may be generalized to symbols of a finite alphabet and that a binary sequence is a special case. Suitable modifications to some aspects of the following description to incorporate more than two symbols will be appreciated by those ordinarily skilled in the art.

Codeword Generation

The present application, in one aspect, describes an entropy coding and decoding process that employs encoding trees for resolving codewords. Leaves of the trees are each associated with a codeword from a primary codeword set and internal nodes of the trees are associated with codewords of a secondary codeword set. Generation of the encoding trees and codewords may be performed offline.

The input sequence can be understood as being n input sources interleaved arbitrarily, where each of the n sources is associated with an estimated probability value.

Consider a finite set of probabilities $P=\{p_k | 1 \leq k \leq n, 0 < p_k \leq 0.5\}$. The $p_k$ values are regarded as probability values for the Least Probable Symbol (LPS); their complements are of the form $1-p_k$, and they belong to the Most Probable Symbol (MPS). In practice, the selection of $p_k$ (or equivalently the index k) to encode the next bit is determined from the context, which itself is determined from the encoded history. In context adaptive or stateful encoding the probability $p_k$ depends on the current state of the input sequence. The number of probabilities, n, may be set depending on a number of factors, including desired complexity. In H.264/AVC CABAC, for example, the number n is 64.

For each $p_k$ of P, a full binary tree is generated, where every path in the tree defines a bit sequence, and every node on that path, including the leaf, designates a value of the form $p_k^u \cdot (1-p_k)^v$, where u is the number of LPS and v is the number of MPS in the path.

To generate the binary trees, for each $p_k$ of P, symbols (bits) are combined into a set of sequences $S_k$ subject to certain constraints. Example constraints may include:

1. No sequence probability is lower than a threshold value.
2. The number of sequences is smaller than a limit value.
3. An efficient codeword set exists for $S_k$.
4. The set of sequences $S_k$ are capable of a convenient or efficient representation in the structure of the given embodiment.

In one example embodiment, these constraints may be specified as:

1. No sequence probability is lower than $2^{-16}$
2. The number of sequences $|S_k|$ is less than 4096.
3. An efficient Huffman codeword set exists for $S_k$.
4. Elements of $S_k$ have special forms that enable 30-bit representation.

Various algorithms may be employed to balance relevant constraints in generating suitable binary trees and respective codewords.

The binary tree generation process results in two Huffman code sets for each index k: a primary Huffman code set $HL_k$ and a secondary Huffman code set $HN_k$. The primary Huffman codewords in the primary Huffman code set $HL_k$, are associated with the leaves of the binary tree for k, whereas the secondary Huffman codewords in the secondary Huffman code set $HN_k$ are associated with the internal nodes of the binary tree. In other words, the primary code words are each associated with one of the sequences of $S_k$, whereas the secondary Huffman codewords are each associated with one of the prefixes of a sequence of $S_k$. As will be explained further below, under certain circumstances an input sequence may terminate before completing a sequence of $S_k$, and thus the secondary codeword may be used to encode the prefix (the partially complete sequence of $S_k$).

The resulting code sets are variable-to-variable length code sets.

The code sets are written in two forms: one specifying the encoder tree, the other the decoder tree, for source k. Every leaf node of the encoder tree will have a certain probability associated with it: $p_k^u \cdot (1-p_k)^v$. Therefore, the parsed words can be encoded using a prefix-free code based on these probabilities. This forms the basis of the decoder tree.

The encoder tree for each source k may, in one embodiment, include both primary and secondary codewords, for example in a linked table, using an integer code for each node to hold the codeword. The bit field for each node may, in one embodiment, be structured as follows:

0 . . . 15: Huffman code for that node (primary or secondary)
16 . . . 19: Length of Huffman code, minus 1
20 . . . 31: Index of left child; 0 for leaves In a binary tree, a convention may be used that the left child corresponds to a 0 bit, for example. The table may be structured to have the right child follow immediately behind the left child in the table. In this manner, the encoder is able to navigate the table bit-by-bit using the binary input sequence. When the encoder reaches a leaf node (as indicated by the index portion of the field), the encoder knows the Huffman code is a primary codeword and it may output the primary codeword for that sequence of $S_k$. Further details regarding example embodiments of the encoding process are provided below.

An example set of primary codewords is set out in the following table. The following table is generated for $p_k$=0.20, with a probability threshold set to 0.13 (parsing ends when the sequence probability reaches a value less than 0.13). The resulting tree contains 14 leaves. Altogether, this achieves an estimated source entropy 0.7250, which is only 0.42% higher than the theoretical limit of $(p_k*\log(p_k)+(1-p_k)*\log(1-p_k))$= 0.7219.

TABLE 1

Example Primary Code Set

| Parsed Sequence | Sequence Probability | Codeword |
|---|---|---|
| 00 | 0.040000 | 11010 |
| 010 | 0.032000 | 11011 |
| 011 | 0.128000 | 000 |
| 100 | 0.032000 | 11100 |
| 101 | 0.128000 | 001 |
| 110 | 0.128000 | 010 |
| 1110 | 0.102400 | 011 |
| 11110 | 0.081920 | 1010 |
| 111110 | 0.065536 | 1011 |
| 1111110 | 0.052429 | 1100 |
| 11111110 | 0.041943 | 11101 |
| 111111110 | 0.033554 | 11110 |
| 1111111110 | 0.026844 | 11111 |
| 1111111111 | 0.107374 | 100 |

Encoding Process

As described above, the encoder includes a primary code set $HL_k$ for each source k and a secondary code set $HN_k$ for each source k. The codewords for each of the codesets may be incorporated into an encoding table, as described above. The encoder, in such an embodiment, would have k encoding tables stored in memory to represent the k encoding trees and the codewords associated with each node of the trees.

Figure 4:
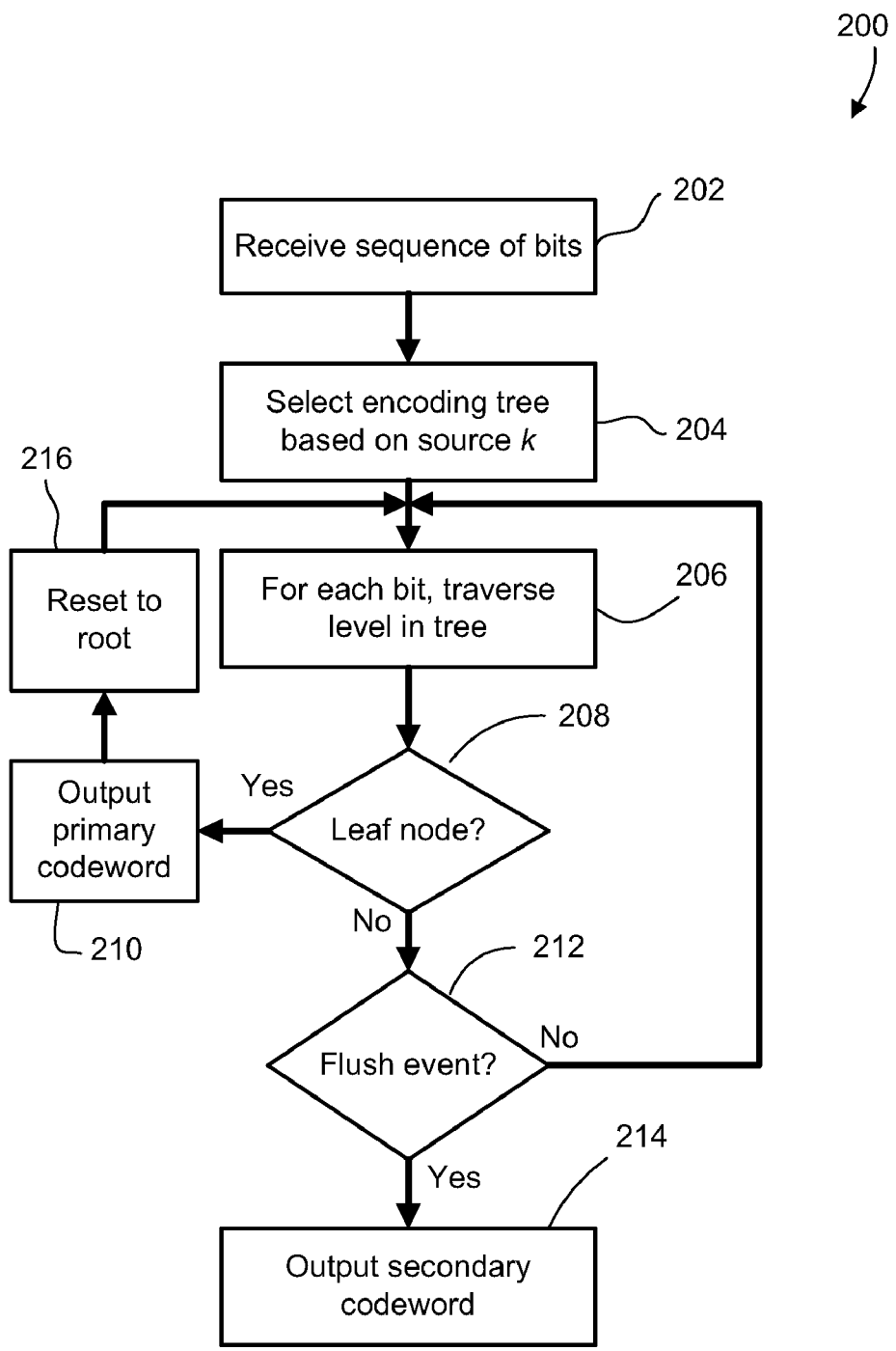
FIG. 4 shows an example method for encoding an input sequence.

Reference is now made to FIG. 4, which shows an example method 200 for encoding an input sequence. In this embodiment, the sequence is a binary sequence. In this example method 200, a single source sequence is assumed. Other embodiments dealing with interleaved sources are addressed further below.

The method 200 begins with receipt of the binary sequence in step 202 and selection of an encoding table or tree on the basis of the probability estimate $p_k$ associated with the binary sequence in step 204. As noted above, the method 200 is assumed to apply to a single source sequence for a fixed probability estimate $p_k$. The binary sequence may, for example, be a binary sequence of bits associated with the probability estimate $p_k$ extracted from an input sequence x.

Using the selected encoding tree, in step 206 the tree (or table in some implementations) is traversed bit-by-bit using the binary sequence. At each bit, in step 208, the encoder assesses whether the sequence thus far results in a leaf node in the tree (or table). If so, then in step 210 a primary codeword is output. Then in step 216, the encoder returns to the root of the tree and continues to process the binary sequence at step 206.

If the bit does not result in a completed primary codeword at step 208, then the encoder may assess whether a flush event occurs in step 212. Possible flush events are discussed further below; however, example flush events include the end of the input sequence or a buffer-full condition. If a flush event occurs while the encoder is at an internal node of the tree, then in step 214 a secondary codeword associated with the internal node is output. If no flush event occurs, the encoder returns to step 206 to continue bit-by-bit processing of the binary sequence.

As indicated above, for an input binary sequence x, the encoder evaluates an estimated probability value $p_i$ for each bit based on its context. The estimated probability value $p_i$ is used to classify the bit as belonging to one of n sources, where each source is associated with one of the probability values $p_k$ in P. The sources are encoded independently using their respective encoding trees and $HL_k$ and $HN_k$ codewords. The encoder generates a bitstream of encoded data containing the codewords for the n sources.

The decoder receives the bitstream and extracts the codewords. Based on context, it identifies which source the codewords are each associated with and, on that basis, regenerates the bit sequence from the codeword. The regenerated bits of the various sequences are then interleaved by the decoder, again based on estimated probabilities evaluated on a bit-by-bit basis using the same context model employed by the encoder.

It will be appreciated that in an interleaved sources embodiment, the primary codewords for various sources are not necessarily resolved in the same order in which they are initially started. For example, when processing a bit sequence, the encoder may initially encounter bits associated with probability $p_1$ and start traversing an encoding tree associated with probability $p_1$. However, before the encoding tree reaches a leaf, the input sequence may supply bits associated with probability $p_2$. It is possible that the encoder will reach a leaf node and, thus, a primary codeword, for the source associated with $p_2$ before it reaches a leaf node for the source associated with $p_1$. In order to ensure that the decoder is able to determine which codewords are associated with which sources, the encoder ensures that the codewords are output in the order in which each was started, irrespective of which codeword was completed first.

In accordance with one aspect of the present application, the encoder ensures that codewords are output in the correct order by using a first-in-first-out buffer. The buffer may be a cyclic buffer.

Figure 5:
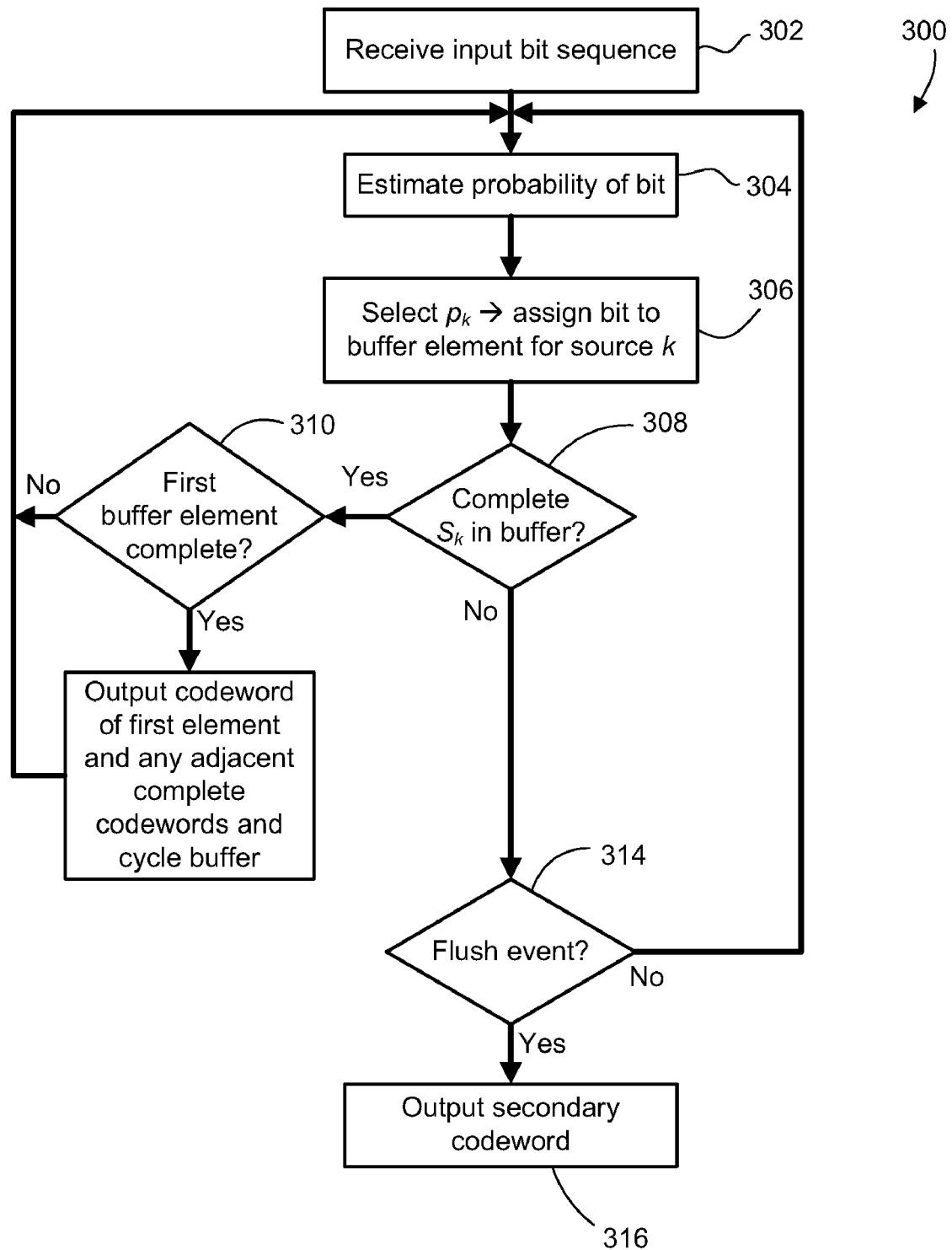
FIG. 5 shows, in flowchart form, another example method for encoding an input sequence.

Reference is now made to FIG. 5, which shows, in flowchart form, a method 300 for encoding an input sequence. In this example embodiment, the input sequence is assumed to be a binary sequence. The method 300 begins with receipt of the input sequence in step 302. For each bit in the input sequence, the encoder uses context to determine an estimated probability $p_k$ associated with the bit in step 304. In many embodiments, the estimated probability $p_k$ is based upon a context model and one or more preceding bits in the sequence. The first bit in the sequence may be assigned a default estimated probability. In step 306, based on the estimated probability $p_k$ associated with the bit, the bit is added to a buffer element associated with that estimated probability $p_k$, i.e. with that source k.

In an embodiment in which a first-in-first-out (FIFO) buffer is employed, the encoder may, in step 306, assess whether there is buffer element containing an incomplete sequence of $S_k$ for the source k within the buffer. If so, the bit is appended to the sequence in that buffer element. If not, then the encoder allocates a new buffer element for source k. Buffer elements are allocated in a FIFO manner, to ensure that the first completed codeword output from the buffer will be the codeword for the first sequence started.

In an embodiment in which an encoding table is used to store the encoding tree, wherein each node is represented by its secondary or primary code word plus an index to the left child node or an indicator that it is a leaf node, the sequence of bits itself may not be retained in the buffer element. Rather, the encoder may store the encoding tree node integer value in the buffer element. The encoding tree node integer value indicates, for example, the secondary Huffman code word associated with a given prefix and an index to the left child node. The next bit received for the source k leads the encoder to one of the child nodes in the encoder table and, on that basis, it overwrites the buffer element with the encoder tree node integer associated with the relevant child node of the encoder table. Once the encoder table reaches a leaf node, the index portion of the node integer signals that the codeword is complete, i.e. that a leaf node has been reached and the value in the codeword portion of the integer is a primary codeword.

In yet another embodiment, the buffer elements may not be used to either store the symbols or store secondary codewords. A separate array or other memory structure may be used to keep track of sequences of symbols associated with each of the estimated probabilities and/or to keep track of a current node in each of the encoding trees in use. The buffer elements in such an embodiment may only be written to once the process reaches a leaf node and, thus, a primary codeword, or once a flush event occurs in which case a secondary codeword is written to the buffer element.

In step 308, the encoder assesses whether the sequence of $S_k$ to which the bit was just appended is now complete. In other words it may assess whether the sequence has reached a leaf node in the encoding tree for source k. As indicated above, the node integer itself from the relevant encoding tree may be stored in the buffer element in some embodiments, and not the bits of the sequence of $S_k$, in which case step 308 involves evaluating whether the index portion of the node integer indicates a leaf node. In yet other embodiment, neither the bits of the sequence nor the node integers are stored in the buffer elements, but rather are stored in a separate array.

If a leaf node has been reached, and therefore a primary codeword from $HL_k$ is stored in the buffer element for source k, then the encoder evaluates in step 310 whether the first buffer element contains a primary codeword. If not, the completed codeword for source k is retained in its position in the buffer and the encoder returns to process the next bit at step 304. If the bit just processed has resulted in completion of the codeword in the first buffer element, then in step 312 the encoder may output the primary codeword from the first buffer element and as many primary codewords as are present in the consecutively following buffer elements until it reaches a buffer element without a primary codeword, i.e. until it reaches a buffer element that is at an internal node of its respective encoding tree. That buffer element then becomes the first buffer element in the cyclic buffer and the encoder returns to step 304 to process the next bit in the input sequence.

In another embodiment, the encoder may retain completed codewords in their respective buffer elements until a number of completed codewords are stored in consecutive buffer elements before outputting them. As will be described below, in one embodiment a codeword type indicator is based on whether a predicted number of consecutive primary codewords is true or false; in that type of implementation it may be advantageous to retain the completed codewords in the buffer in order to assess whether the predicted number is reached. In such an implementation, the buffer may output completed codewords when either the predicted number of consecutive primary codewords is reached or a flush event occurs, which results in at least one secondary codeword. Further details regarding codeword indicators are given in a later section of this description.

If the bit does not result in a completed primary codeword in step 308, then the encoder determines whether a flush event has occurred in step 314. If not, then the encoder returns to step 304 to continue processing the next bit in the input sequence. If a flush event has occurred, then in step 316 the encoder flushes one or more buffer elements (in FIFO manner) by outputting the secondary codewords for the incomplete sequences.

Flush events are events in which it becomes necessary to output a codeword for an incomplete sequence $S_k$. One example flush event is the end of an input sequence. This may occur, for example, at the end of a video, a frame, a slice, or at other such breaks in the binary sequence. A flush event of this nature results in flushing the entire buffer so that the entire remainder of the encoded sequence is output in the bitstream.

Another example flush event is when the buffer become full. For example, if the first element of the buffer contains an incomplete codeword for source k, and the remainder of the buffer elements are allocated, if it become necessary to allocate an additional buffer element for a certain source before the codeword for the first element is complete, it may be necessary to flush the first element before it is complete. It will be understood that this type of flush event may only necessitate the flushing of the first element, and not necessarily the entire buffer.

Other example flush events will be appreciated by those ordinarily skilled in the art having regard to the present description.

A simplified example is now given to illustrate aspects of the encoding process. In this simplified example, we will assume only two sources, A and B. For illustration purposes, we will use the codewords shown above in the example code set of Table 1 for both sources A and B (it will be appreciated that in a practical implementation each source would have its own encoding tree and primary and secondary code sets). The example input sequence, and the context for each bit of the input sequence (and thus it source assignment) is set out below:

| A | A | B | B | B | B | B | B | A | A | A |
|---|---|---|---|---|---|---|---|---|---|---|
| 1 | 0 | 1 | 1 | 1 | 0 | 1 | 0 | 0 | 1 | 1 |

The encoder begins by allocating a buffer element (the first buffer element) to source A and beginning in the encoder tree for source A at the root and travelling to the internal node represented by a 1, which is associated with a particular secondary codeword. It then moves to the internal node represented by the sequence 10. In some embodiments, a secondary codeword associated with 10 may now written to the first buffer element, or otherwise tracked or stored in memory. The context indicates that the next bit is associated with source B, so the encoder allocates a new buffer element for source B and begins to traverse the encoding tree for source B following the sequence 1, 1, 1, 0, whereupon it arrives at a leaf node for the sequence 1110. Accordingly, the codeword 011 is written to the buffer element. It is not, however, output to the bitstream at this point because the first element for source A contains an incomplete sequence.

The next bit in the sequence is a 1 for source B. Because the element associated with source B contains a complete sequence $S_k$, the encoder allocates the next free buffer element to source B and begins traversing the encoding tree for source B starting from the root and going to the child node associated with bit 1. The next bit is a 0 also associated with source B, giving the sequence 10.

The next bit in the sequence is a 0 for source A, which is assigned to the first buffer element. Accordingly, the encoder travels from the internal node associated with 10 to the child node for the sequence 100, which is a leaf node corresponding to the primary codeword 11100. This primary codeword is written to the first element.

The first element (containing codeword 1110), second element (containing codeword 11100) are now output to generate the bitstream in this embodiment (as noted above, in some cases a number of consecutive primary codewords may be retained in the buffer to assess a prediction). The third buffer element containing the incomplete sequence 10 for source B now becomes the first buffer element. The next bit in the sequence however is a 1 for source A, so the encoder allocates a new buffer element for source A and begins to traverse the encoding tree for source A from the root to the internal node associated with bit 1. The last bit of the sequence contains a 1 for source 1. Accordingly at the end of the sequence, the buffer contains two incomplete elements: source B has an element containing 10 and source A has an element containing the sequence 11. As a result, secondary codewords for source B sequence 10 and source A sequence 11 are output to the bitstream.

It will be appreciated that if the primary and second codewords are overlapping, i.e. not mutually exclusive, the decoder needs a mechanism to determine whether a codeword in the bitstream is a primary codeword or a secondary codeword. One possible mechanisms is an explicit "escape" codeword in the primary code set, which indicates that the codewords following the escape code are secondary codewords. It will be appreciated that an "escape" codeword of this nature is applicable to an end-of-sequence type flush event.

Decoding Process

The decoder stores the code sets for each source k in decoder tree/table structures. For example, each source k may include a primary decoding tree for parsing primary codewords and regenerating the corresponding bit sequence, and a secondary decoding tree for parsing secondary codewords and regenerating the corresponding partial bit sequence. Each decoding tree for a source k may contain an integer for each node for parsing the codewords. Inner nodes may include an index to one or more child nodes. Leaf nodes may contain the sequence corresponding to the parsed codeword.

In one example, the code syntax may include special codes for certain sequences. For example, the sequences "111 . . . 111" and "111 . . . 110" may have special codes. The following structure, in which a 32-bit integer is used for each node of a decoding tree, uses two bits to indicate a node type. In this example embodiment, bits 30:31 are used to indicate the node type:

| 30 . . . 31: | Node type |
|---|---|
| | Node type = 0 |
| 0 . . . 15: | Index of leftmost child |
| 16 . . . 29: | Log-number of children |
| | Node type = 1 (short sequence) |
| 0 . . . 24: | The parsed bit sequence |
| 25 . . . 29: | Sequence length |
| | Node type = 2 (form 111 . . . 110) |
| 0 . . . 29: | Sequence length |
| | Node type = 3 (form 111 . . . 111) |
| 0 . . . 29: | Sequence length |

The decoder traverses the decoding tree to resolve a codeword in the bitstream into a bit sequence. To speed up the decoding, the decoder may be configured in a greedy fashion to begin with reading out the minimum remaining codeword length. For example, using the codewords listed in Table 1, above, the minimum codeword length is three bits, meaning that the decoder may start with an evaluation of the first three bits of the codeword to index a location in the decoding table and, thus, quickly identify a leaf or internal node at which to begin traversing the tree.

It will be appreciated that the decoder interleaves bits of the bit sequences decoded from the codewords based on estimated probabilities given by the context model.

Figure 6:
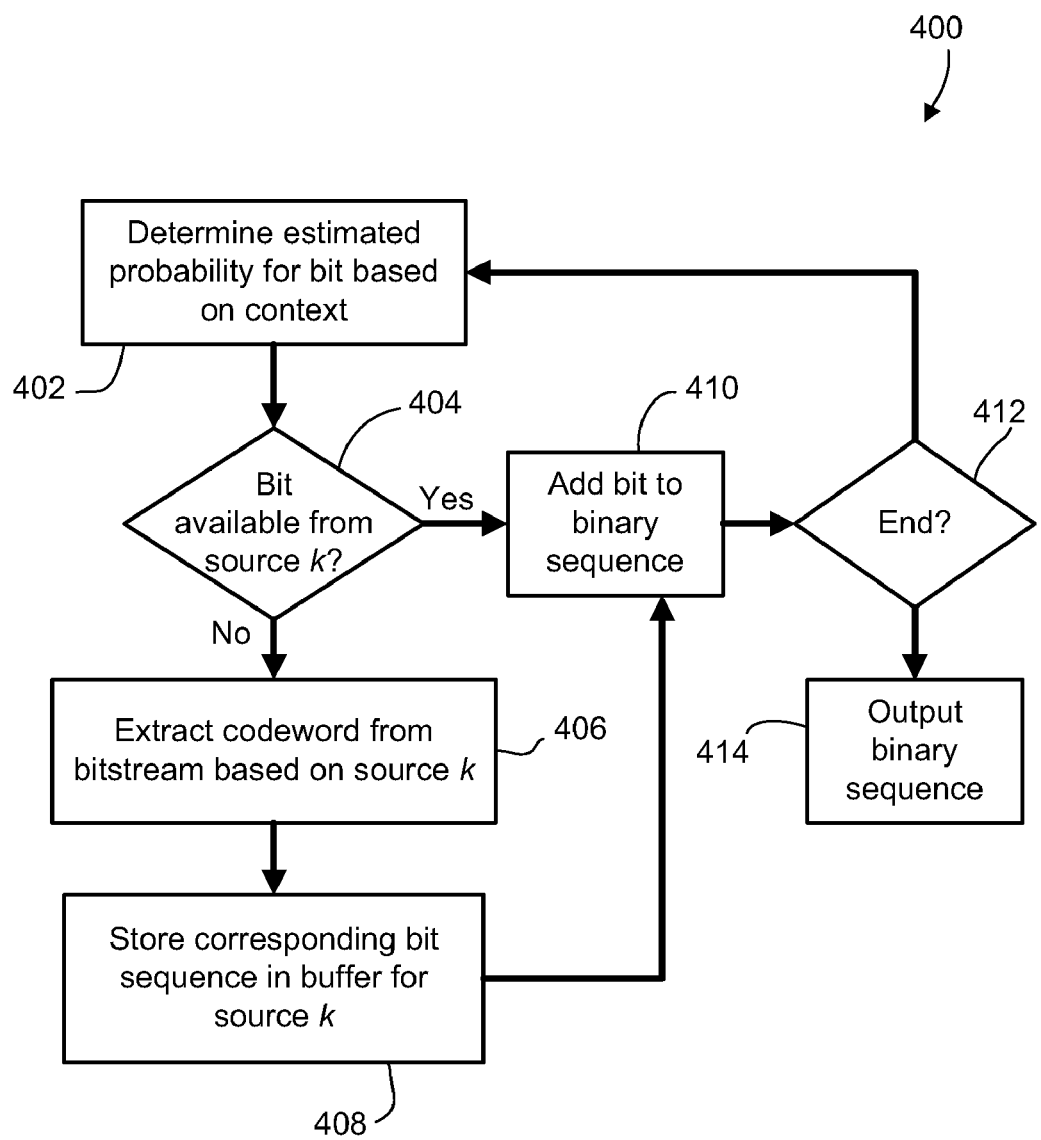
FIG. 6 shows, in flowchart form, an example method for entropy decoding a bitstream of encoded data.

Reference is now made to FIG. 6, which shows, in flowchart form, an example method 400 for entropy decoding a bitstream of encoded data. The method 400 employs the same context model used at the encoder for generating the bitstream of encoded data. The bitstream includes the codewords produced by the entropy coder at the encoder. The decoder generates the bit sequences corresponding to the codewords and interleaves the bits of the bit sequences in accordance with the context model. The method 400 results in output of a reconstructed binary sequence.

In particular, at step 402, the decoder determines an estimated probability for a bit based on a current context. At the outset, the estimated probability may be a default probability.

The estimated probability is then used to determine the source from which the next bit is to come, i.e. the source k associated with the estimated probability. In step 404, the decoder determines whether there are decoded bits available from that source k. If not, then in step 406 the decoder parses the incoming bitstream to extract the next codeword. It does so using the decoder tree (or table) for source k to identify the codeword and identify the corresponding bit sequence. The bit sequence may be stored in a field or buffer associated with source k, as indicated by step 408. The first bit of that bit sequence is then added to the reconstructed binary sequence in step 410.

In step 412, the decoder may assess whether it has reached the end of the reconstructed binary sequence, which may occur when there are no further unconsumed bit sequences for any of the sources and there are no further codewords in the bitstream. In that case, the method 400 ends with output of the binary sequence in step 414. Otherwise, it returns to step 402 to update the context and determines the source of the next bit for the reconstructed binary sequence. If the next bit for the reconstructed binary sequence is available, as determined in step 404, then it proceeds immediately to step 410 to consume that bit (for example, from the field, register or buffer in which it is stored) and add it to the reconstructed binary sequence. If it is not available, either because that source has not been reference previously or because the bit sequence last decoded for that source has been consumed, then the decoder parses the bitstream to identify the next codeword in step 406, and so on.

It will be appreciated that the foregoing description of the decoding process referred to the decoding tree for the source k without referring to whether it was the primary tree or the secondary tree. Because the primary codewords will be used far more often than the secondary codewords, and the use of the secondary codewords will be bursty, a suitable mechanism may be used to inform the decoder when secondary codewords are being used. As noted previously, an "escape" codeword may be used in the primary codeset to signal that the following codewords are secondary codewords. With such an implementation, the decoder assumes it is using the primary decoding trees until it detected the escape codeword, in which case it switches to using the secondary decoding trees for subsequent codewords. As mentioned previously, the "escape" codeword mechanism is suitable for end-of-sequence flush events. Other mechanisms may be more suitable if flush events are expected at intervals other than an end-of-sequence event, such as during a buffer-full event.

An embodiment of another suitable mechanism is described in the next section. Before turning to that mechanism, an alternative encoding and decoding embodiment is described.

In one alternative embodiment, instead of outputting each codeword in the order in which it was started, i.e. on a first-in-first-out basis, codewords are grouped. This embodiment addresses a possible processor cache speed limitation at the decoder. In the embodiment described above, the encoder generates a bitstream of codewords in which adjacent codewords may be associated with different estimated probabilities. As a result, at the decoder when decoding a codeword, the decoder in many embodiments will determine the applicable associated decoding tree (in many cases, a table) based on the context-based estimated probability, and will load the applicable associated decoding tree into fast access memory, such as a cache memory, e.g. a processor cache memory. However, this type of fast access memory is often limited in size, which in some embodiments may mean that each table must be flushed from the cache before a different decoding tree/table associated with a different estimated probability may be loaded to the cache. In an embodiment in which the bitstream is structured such that each consecutive codeword is likely associated with a different decoding tree, this can mean a new decoding tree/table must be loaded to cache memory to decode each codeword. The repeated flushing and loading of decoding trees/tables to memory may impose a hardware-related speed limitation on the decoding process.

To address this issue, at the encoder side, the FIFO buffer may use buffer elements configured to hold more than one codeword for an associated estimated probability. Such a buffer still operates on a FIFO basis, however, the first element is only output when the requisite number of codewords in the element are completed. In one such example embodiment, the buffer element may be sized to hold eight codewords. In other words, rather than outputting codewords associated with an estimated probability on an FIFO basis each time the first element of the FIFO buffer contains a complete codeword, the codewords are output on a FIFO basis each time the first element of the FIFO buffer contains a predetermined number of complete codewords. It will be appreciated that this does not necessarily mean that all eight (or however many) codewords are physically stored in the first element of the buffer provided suitable linking between buffer elements associated with the same estimated probability is provided.

At the decoder, when decoding interleaved codewords the decoder knows that a predetermined number of codewords associated with the same estimated probability will be present consecutively in the bitstream. Accordingly, when decoding a codeword associated with an estimated probability, the decoder decodes the predetermined number of codewords using the same decoding tree/table. This allows the decoder to complete decoding of more than one codeword using the same decoding tree/table without having to clear the cache and load a new decoding tree/table for each codeword.

Code Selection

One example embodiment of a bitstream structure that is designed to accommodate code selection signaling is set out below. The bitstream contains codewords from either a primary codeset or secondary codeset, where the primary codeset is used much more frequently than the secondary codeset and the secondary codewords tend to come in bursts. In this example, a codeword type indicator is placed in the bitstream. To avoid excessive overhead associated with inserting this codeword type indicator, the following example relies upon the fact that the secondary codewords are used much less frequently.

An estimate $p_s$ of the probability of a secondary codeword is formed. From the estimate, a predicted number of consecutive primary codewords is generated as $L(p_s)$. If the prediction is true, i.e. if the next $L(p_s)$ consecutive codewords are primary, then a "true" flag is output (such as a "0" bit) in the bitstream, and then $L(p_s)$ codewords are written to the bitstream. Then the prediction is made again. The true flag is one example of the codeword type indicator.

If the prediction is false, i.e. if there is a secondary codeword within the next $L(p_s)$ consecutive codewords, then a "false" flag (such as a "1" bit) is output in the bitstream followed by a location of the secondary codeword, for example its position in bits from the location of the "false" flag. In another embodiment, the location could be given as a number of codewords until the secondary codeword. The consecutive codewords up to and including the secondary codeword are output to the bitstream. Then following the secondary codeword, the decoder returns to make a new prediction. The false flag and location information is another example of the codeword type indicator.

Figure 7:
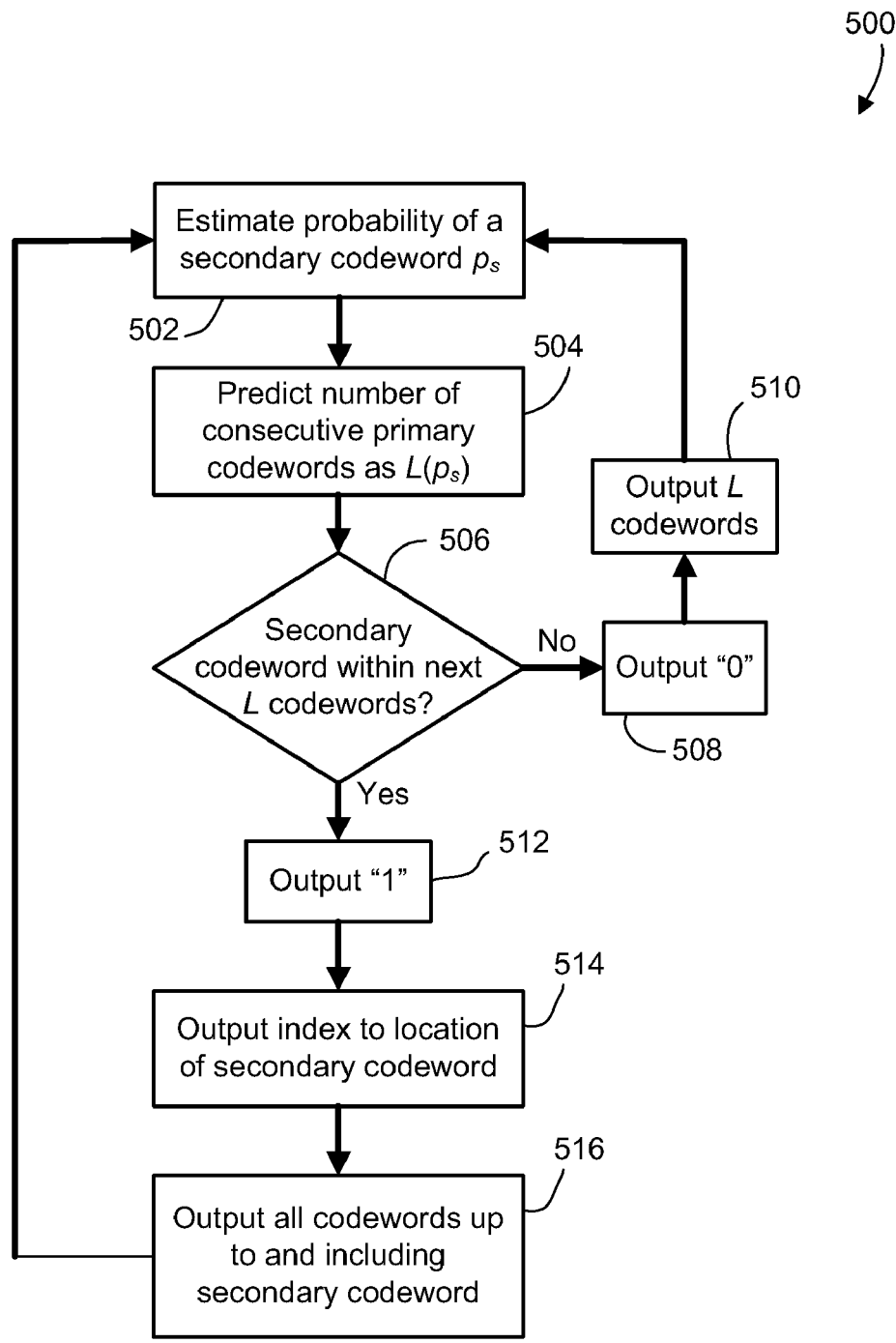
FIG. 7 shows, in flowchart form, an example method of signaling a code selection in a bitstream.

Reference is now made to FIG. 7, which shows, in flowchart form, a method 500 for signaling code selection in a bitstream. The method 500 begins in step 502 with estimating a probability $p_s$ of a secondary codeword. Any suitable algorithm may be used to estimate the probability. In one embodiment, the estimate may be static. In another embodiment, the estimate may be adaptive and depend on the frequency with which secondary codewords have recently been encountered. Such an algorithm would reflect the bursty nature of the use of secondary codewords.

In one example, the estimation of the probability $p_s$ of a secondary codeword depends on whether the immediately preceding codeword was primary or secondary. If it was secondary, and that secondary codeword was itself preceded by N primary codewords, then the probability estimation $p_s$ may rely on a Maximum Likelihood estimation given by $p=1/(N+1)$. If the preceding codeword was primary, then if M primary codewords have occurred since the last secondary codeword, then the Krichevsky-Trofimov estimator may be used to give $p_s=1/(2M+2)$. These methods of selecting the probability estimate $p_s$ for a secondary codewords are examples. Other methods may also be used.

In step 504, the probability estimation $p_s$ is used to predict the number of consecutive primary codewords. Through a mathematical derivation, the number of consecutive primary codewords may be calculated using the expression $L=\ln 2/p_s$. This means that a good approximate estimate for the number of consecutive primary codewords is 0.7 times the number of primary codewords that were observed between the two previous secondary codewords, or 1.4 times the number of primary codewords seen from the last secondary codeword, based on whether the last codeword was primary or secondary, respectively.

In step 506, the encoder assess whether its prediction of $L(p_s)$ consecutive primary codewords was correct. If so, then in step 508 it outputs a codeword type indicator, e.g. a "true" flag, in this case a 0 bit, and then in step 510 it outputs the $L(p_s)$ primary codewords into the bitstream. The method 500 then returns to step 502 to make a new estimate.

If the prediction of consecutive primary codewords is wrong, then in step 512, the encoder outputs a codeword type indicator, e.g. a "false" flag, in the bitstream and follows that with an index to the location of the first secondary codeword within the next $L(p_s)$ codewords in step 514. The encoder then, in step 516, outputs all the codewords up to and including the first secondary codeword referenced in step 514 before returning to step 502 to make a new prediction.

At the decoder, the bitstream so constructed is decoded by making the same predictions. If the flag in the bitstream is a "0", then the decoder knows that the next $L(p_s)$ consecutive codewords are primary. If the flag is a "1", then the decoder extracts the index information and is able to pinpoint the secondary codeword in the bitstream. The next prediction flag follows immediately after the secondary codeword.

Accordingly, the decoder reads the codeword type indicator and, if it indicates the prediction is true, i.e. that the next L codewords are primary, then the decoder processes those consecutive codewords using the primary decoding tree. If it reads a codeword type indicator and finds that the prediction is false, then it reads the location information and processes the consecutive codewords up to the location using the primary decoding tree, and processes the codeword at the location using the secondary decoding tree.

Encoder and Decoder

Figure 8:
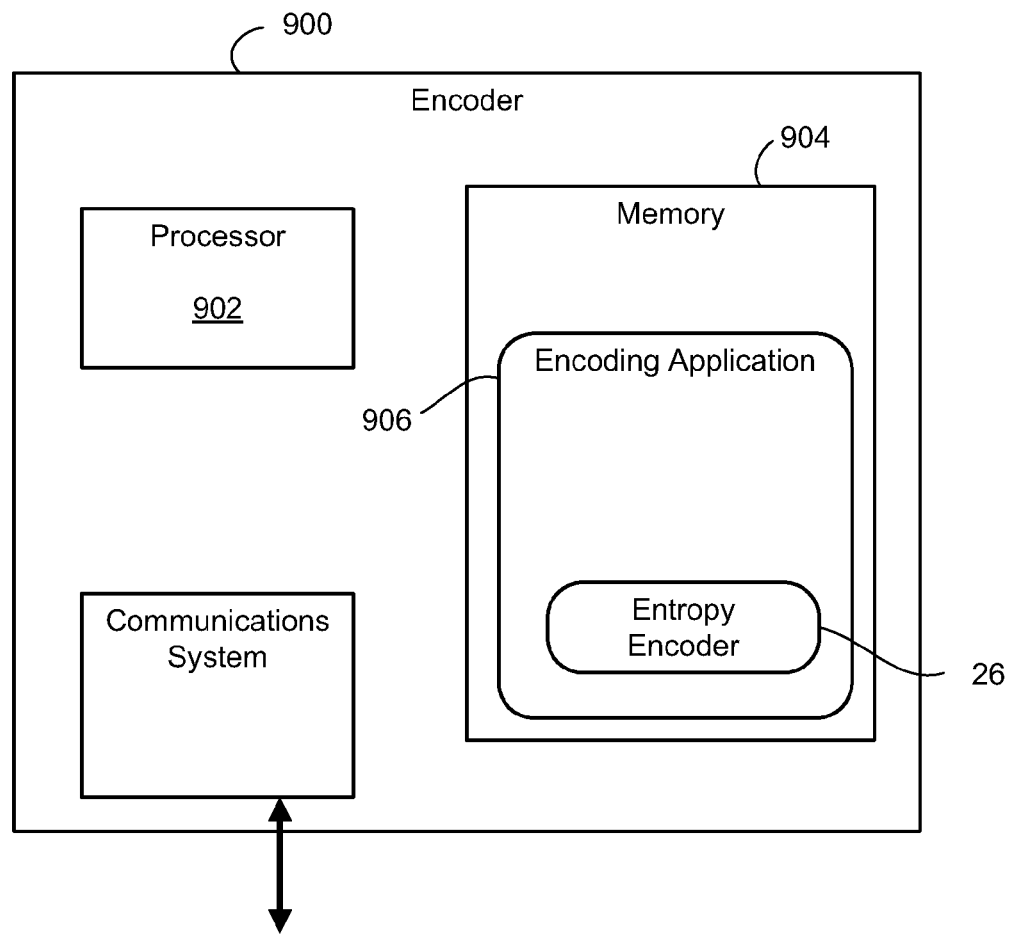
FIG. 8 shows a simplified block diagram of an example embodiment of an encoder.

Reference now made to FIG. 8, which shows a simplified block diagram of an example embodiment of an encoder 900. The encoder 900 includes a processor 902, memory 904, and an encoding application 906. The encoding application 906 may include a computer program or application stored in memory 904 and containing instructions for configuring the processor 902 to perform steps or operations such as those described herein. For example, the encoding application 906 may encode and output video bitstreams encoded in accordance with the process described herein. The encoding application 906 may include an entropy encoder 26 configured to entropy encode input sequences and output a bitstream using one or more of the processes described herein. The memory 904 may include the buffer memory and memory elements described herein. The memory 904 may store the primary and secondary codewords for each of the sources k. As described herein, the codewords may be stored as encoding tables for each of the sources k. It will be understood that the encoding application 906 may be stored in on a computer readable medium, such as a compact disc, flash memory device, random access memory, hard drive, etc.

Figure 9:
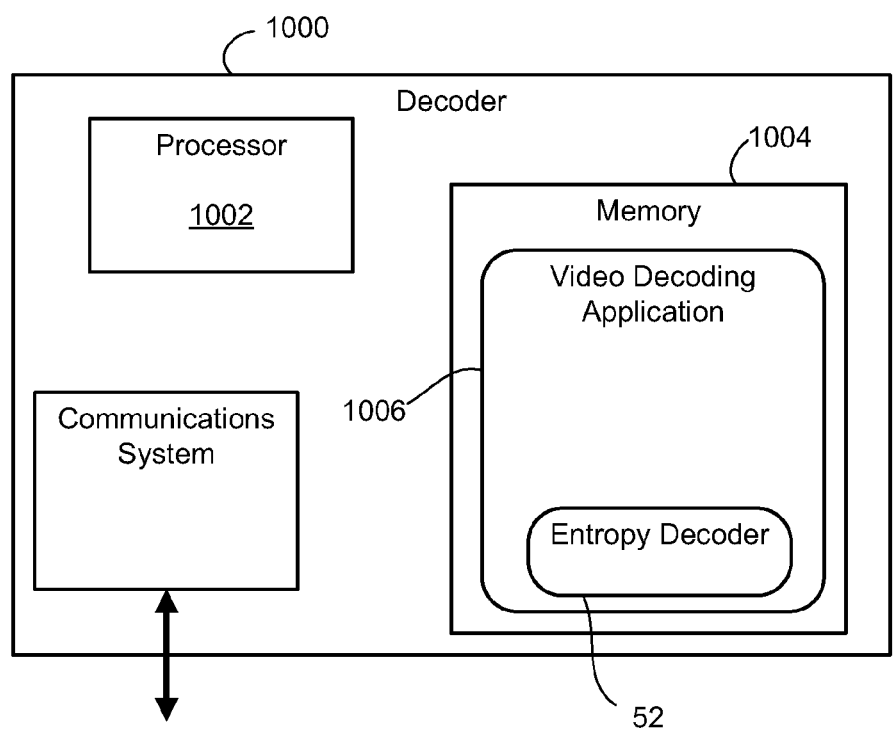
FIG. 9 shows a simplified block diagram of an example embodiment of a decoder.

Reference is now also made to FIG. 9, which shows a simplified block diagram of an example embodiment of a decoder 1000. The decoder 1000 includes a processor 1002, a memory 1004, and a decoding application 1006. The decoding application 1006 may include a computer program or application stored in memory 1004 and containing instructions for configuring the processor 1002 to perform steps or operations such as those described herein. The decoding application 1006 may include an entropy decoder 52 configured to receive a bitstream encoded in accordance with one or more of the processes described herein, and to reconstruct a binary sequence from the bitstream of encoded data as described herein. The decoding application 1006 may configure the processor to traverse stored decoding trees/tables to parse codewords from the bitstream and thereby identify corresponding bit sequences. It may also configure the processor 1002 to interleave the symbols of the decode bit sequences to produce a reconstructed binary sequences, as described herein. It will be understood that the decoding application 1006 may be stored in on a computer readable medium, such as a compact disc, flash memory device, random access memory, hard drive, etc.

It will be appreciated that the decoder and/or encoder according to the present application may be implemented in a number of computing devices, including, without limitation, servers, suitably programmed general purpose computers, set-top television boxes, television broadcast equipment, and mobile devices. The decoder or encoder may be implemented by way of software containing instructions for configuring a processor to carry out the functions described herein. The software instructions may be stored on any suitable computer-readable memory, including CDs, RAM, ROM, Flash memory, etc.

It will be understood that the encoder described herein and the module, routine, process, thread, or other software component implementing the described method/process for configuring the encoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

Certain adaptations and modifications of the described embodiments can be made. Therefore, the above discussed embodiments are considered to be illustrative and not restrictive.

What is claimed is:

1. A method for encoding an input sequence of symbols, the method comprising:
   sequentially, for each symbol in the input sequence,
      determining an estimated probability for that symbol based on a context model,
      identifying a codeword associated with a sequence of symbols resulting from appending that symbol to a previous sequence of symbols associated with that estimated probability, using an encoding tree associated with that estimated probability, and
      storing the codeword in a buffer element of a first-in-first-out buffer, wherein the buffer element is associated with the estimated probability; and
   outputting stored codewords from the buffer in a first-in-first-out order.

2. The method claimed in claim 1, wherein the encoding tree includes secondary codewords for internal nodes and primary codewords for leaf nodes, and wherein the method comprises:
   if the codeword stored in the buffer element comprises a primary codeword, allocating another buffer element associated with the estimated probability and storing a next codeword associated with the estimated probability in the another buffer element.

3. The method claimed in claim 1, wherein the encoding tree includes secondary codewords for internal nodes and primary codewords for leaf nodes, and wherein storing a secondary codeword in the buffer element includes storing the secondary codeword and an index to a child node.

4. The method claimed in claim 1, wherein the first-in-first-out buffer comprises a cyclic buffer.

5. The method claimed in claim 1, further comprising storing the sequence of symbols in the buffer element if the sequence of symbols corresponds to no leaf node of the encoding tree.

6. The method claimed in claim 5, wherein storing the codeword comprises overwriting the sequence of symbols with the codeword when the sequence of symbols corresponds to a leaf node of the encoding tree.

7. The method claimed in claim 1, wherein storing the codeword comprises storing a Huffman code, a length of the Huffman code, and a child node index.

8. The method claimed in claim 1, wherein the estimated probability for that symbol is one of a predefined set of estimated probabilities.

9. The method claimed in claim 1, wherein the input sequence of symbols is a binary sequence.

10. The method claimed in claim 1, wherein the buffer element associated with the estimated probability stores a predetermined number of codewords and wherein outputting comprises outputting stored codewords from a first buffer element when the predetermined number of codewords stored in the first buffer element are complete.

11. An encoder for encoding an input sequence of symbols, the encoder comprising:
   a processor;
   a memory;
   a first-in-first-out buffer; and
   an encoding application stored in memory and containing instructions for configuring the processor to encode the input sequence by
      sequentially, for each symbol in the input sequence,
         determining an estimated probability for that symbol based on a context model,
         identifying a codeword associated with a sequence of symbols resulting from appending that symbol to a previous sequence of symbols associated with that estimated probability, using an encoding tree associated with that estimated probability, and
         storing the codeword in a buffer element of the first-in-first-out buffer, wherein the buffer element is associated with the estimated probability, and
      outputting stored codewords from the buffer in a first-in-first-out order.

12. The encoder claimed in claim 11, wherein the encoding tree includes secondary codewords for internal nodes and primary codewords for leaf nodes, and wherein the encoding application configures the processor to:
   if the codeword stored in the buffer element comprises a primary codeword, allocate another buffer element associated with the estimated probability and store a next codeword associated with the estimated probability in the another buffer element.

13. The encoder claimed in claim 11, wherein the encoding tree includes secondary codewords for internal nodes and primary codewords for leaf nodes, and wherein the encoding application configures the processor to store a secondary codeword in the buffer element by storing the secondary codeword and an index to a child node.

14. The encoder claimed in claim 11, wherein the first-in-first-out buffer comprises a cyclic buffer.

15. The encoder claimed in claim 11, wherein the encoding application configures the processor to store the sequence of symbols in the buffer element if the sequence of symbols corresponds to no leaf node of the encoding tree.

16. The encoder claimed in claim 15, wherein the encoding application configures the processor to store the codeword by overwriting the sequence of symbols with the codeword when the sequence of symbols corresponds to a leaf node of the encoding tree.

17. The encoder claimed in claim 11, wherein the encoding application configures the processor to store the codeword by storing a Huffman code, a length of the Huffman code, and a child node index.

18. The encoder claimed in claim 11, wherein the estimated probability for that symbol is one of a predefined set of estimated probabilities.

19. The encoder claimed in claim 11, wherein the input sequence of symbols is a binary sequence.

20. The encoder claimed in claim 11, wherein the buffer element associated with the estimated probability stores a predetermined number of codewords and wherein the encoding application configures the processor to output stored codewords from a first buffer element when the predetermined number of codewords stored in the first buffer element are complete.

21. A computer-readable medium storing computer-executable instructions for configuring a processor to implement the method claimed in claim 1.

* * * * *